(12) United States Patent
Kobayashi et al.

(10) Patent No.: US 10,504,831 B2
(45) Date of Patent: Dec. 10, 2019

(54) ELECTRONIC CIRCUIT AND CAMERA

(71) Applicant: CANON KABUSHIKI KAISHA, Tokyo (JP)

(72) Inventors: Hideo Kobayashi, Tokyo (JP); Kazuo Yamazaki, Yokohama (JP); Hiroki Hiyama, Sagamihara (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/916,775

(22) Filed: Mar. 9, 2018

(65) Prior Publication Data
US 2018/0197814 A1  Jul. 12, 2018

Related U.S. Application Data

(63) Continuation of application No. 15/044,628, filed on Feb. 16, 2016, now Pat. No. 9,947,615.

(30) Foreign Application Priority Data

Feb. 27, 2015 (JP) ................. 2015-039318

(51) Int. Cl.
 *H01L 23/52* (2006.01)
 *H01L 23/58* (2006.01)
 *H04N 5/376* (2011.01)
(52) U.S. Cl.
 CPC ............. *H01L 23/52* (2013.01); *H01L 23/58* (2013.01); *H04N 5/3765* (2013.01)
(58) Field of Classification Search
 CPC ..... H01L 23/52; H01L 23/522; H01L 23/535; H01L 23/58; H04N 5/3765

USPC .......... 326/47, 101; 327/403, 565; 377/118; 257/208
 See application file for complete search history.

(56) References Cited

U.S. PATENT DOCUMENTS

| 5,153,829 A | 10/1992 | Furuya et al. |
| 5,845,137 A | 12/1998 | Tanaka |
| 5,994,946 A | 11/1999 | Zhang |

(Continued)

FOREIGN PATENT DOCUMENTS

| CN | 1402259 A | 3/2003 |
| CN | 101783863 A | 7/2010 |

(Continued)

OTHER PUBLICATIONS

Oct. 10, 2018 Office Action in Chinese Patent Application No. 201610098605.8 (with English translation).

*Primary Examiner* — William Hernandez
(74) *Attorney, Agent, or Firm* — Venable LLP

(57) ABSTRACT

An electronic circuit includes a generating circuit for generating a first group of signals and a second group of signals, and a transmission path for transmitting the first group of signals and the second group of signals. The first group of signals are composed of signals synchronized with a first edge that is one of the rising edge and the falling edge of a reference clock, and the second group of signals are composed of signals synchronized with a second edge that is the other of the rising edge and falling edge. The transmission path includes first transmission lines for transmitting the signals composing the first group and second transmission lines for transmitting the signals composing the second group, and the first and second transmission lines are alternately arranged.

18 Claims, 11 Drawing Sheets

(56) References Cited

U.S. PATENT DOCUMENTS

| | | |
|---|---|---|
| 6,703,868 B2 | 3/2004 | Savaria et al. |
| 8,969,771 B2 | 3/2015 | Ikeda et al. |
| 9,270,905 B2 | 2/2016 | Ogura et al. |
| 9,501,092 B1 * | 11/2016 | How .......................... G06F 1/12 |
| 10,154,218 B2 * | 12/2018 | Hagihara ................ H03M 1/56 |
| 2002/0012401 A1 * | 1/2002 | Karolys ................ G08C 15/02 |
| | | 375/257 |
| 2003/0026162 A1 | 2/2003 | Matsui |
| 2003/0117301 A1 | 6/2003 | Savaria et al. |
| 2010/0182448 A1 | 7/2010 | Takahashi |
| 2011/0298955 A1 | 12/2011 | Horimoto et al. |
| 2014/0375851 A1 | 12/2014 | Lee et al. |
| 2015/0124137 A1 | 5/2015 | Sato et al. |
| 2015/0138411 A1 | 5/2015 | Nakamura et al. |

FOREIGN PATENT DOCUMENTS

| | | |
|---|---|---|
| CN | 102355238 A | 2/2012 |
| CN | 104303496 A | 1/2015 |
| JP | 2-284449 A | 11/1990 |

* cited by examiner

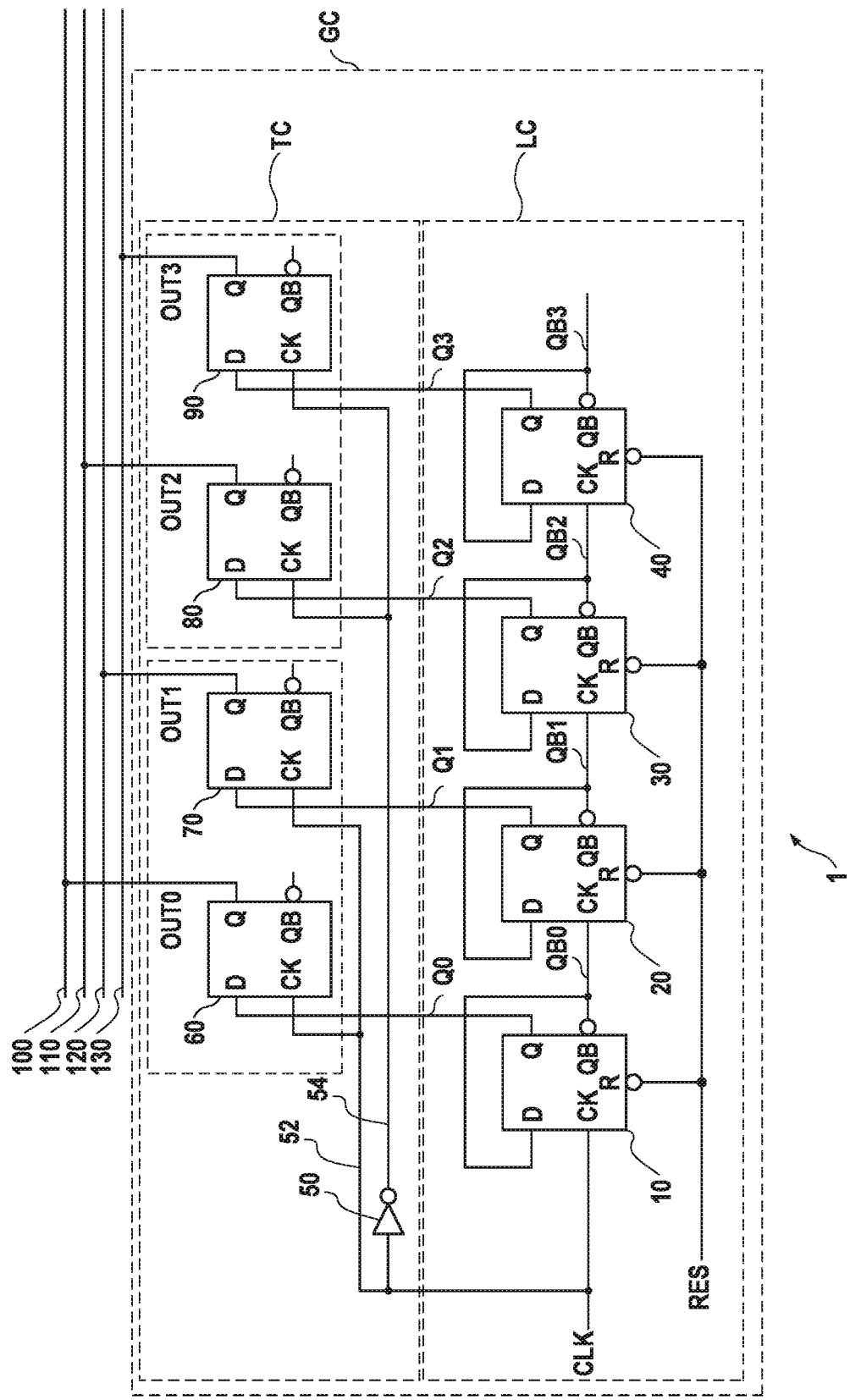
F I G. 1

ELECTRONIC CIRCUIT AND CAMERA

BACKGROUND OF THE INVENTION

Field of the Invention

The present invention relates to an electronic circuit and a camera.

Description of the Related Art

When the distance between signal lines decreases, the parasitic capacitance between the signal lines becomes a problem. Particularly, when signals of opposite phases are output to two adjacent signal lines, signal transition is delayed due to the parasitic capacitance between the two signal lines. Japanese Patent Laid-Open No. 2-284449 discloses an invention with an objective to solve this problem which occurs when signals of opposite phases are output to two adjacent signal lines. Specifically, Japanese Patent Laid-Open No. 2-284449 discloses a semiconductor storage device which includes a first group of signal lines composed of a plurality of signal lines for transmitting in-phase signals and a second group of signal lines composed of a plurality of signal lines for transmitting signals of a phase opposite to that of the first group of signal lines. In this semiconductor device, the distance between the first group of signal lines and the second group of signal lines is greater than the distance between the signal lines within the same group of signal lines.

Such a method which reduces signal transition delays due to parasitic capacitance by increasing the distance between the signal lines, as that disclosed in Japanese Patent Laid-Open No. 2-284449, increases the area occupied by each group of signal lines and leads to an increase in circuit area.

SUMMARY OF THE INVENTION

The present invention provides a technique advantageous in suppressing the increase in circuit area while increasing the speed of signal transmission.

One of aspects of the present invention provides an electronic circuit comprising: a generating circuit configured to generate a first group of signals and a second group of signals; and a transmission path configured to transmit the first group of signals and the second group of signals, wherein the first group of signals are composed of a plurality of signals synchronized with a first edge that is one of the rising edge and the falling edge of a reference clock, and the second group of signals are composed of a plurality of signals synchronized with a second edge that is the other of the rising edge and falling edge of the reference clock, and the transmission path includes a plurality of first transmission lines configured to transmit the plurality of signals composing the first group of signals and a plurality of second transmission lines configured to transmit the plurality of signals composing the second group of signals, and the plurality first transmission lines and the plurality of second transmission lines are alternately arranged.

Further features of the present invention will become apparent from the following description of exemplary embodiments with reference to the attached drawings.

BRIEF DESCRIPTION OF THE DRAWINGS

FIG. 1 is a diagram showing the arrangement of an electronic circuit or a counter according to the first embodiment;

DESCRIPTION OF THE EMBODIMENTS

Figure 2:
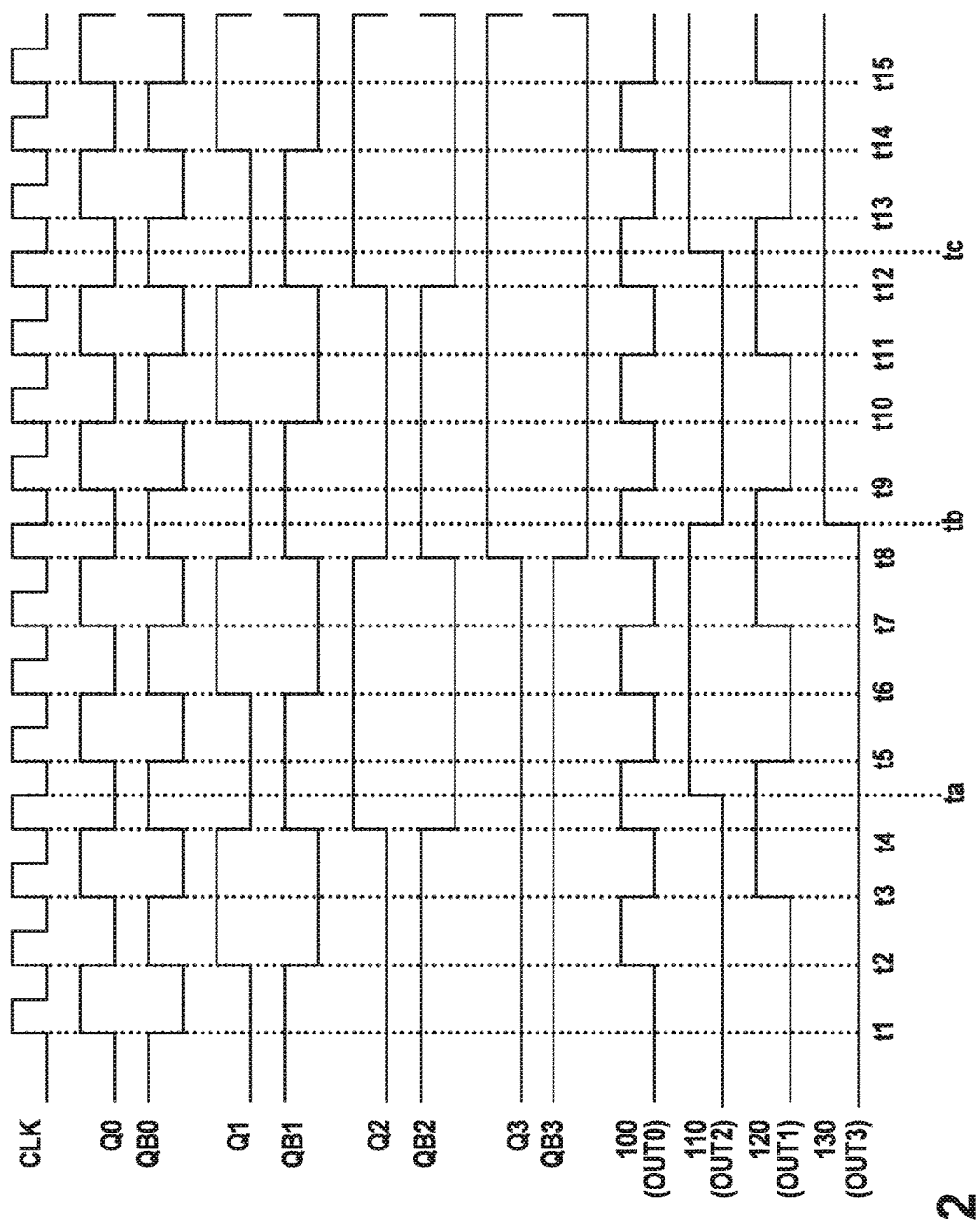
FIG. 2 is a timing chart showing an operation example according to the first embodiment.

Exemplary embodiments of the present invention will be described below with reference to the attached drawings.

An electronic circuit 1 according to the first embodiment of the present invention will be described with reference to FIG. 1. The electronic circuit 1 includes a generating circuit GC which generates a first group of signals and a second group of signals and a transmission path TP which transmits the first group of signals and the second group of signals. The first group of signals is composed of a plurality of signals OUT0 and OUT1 synchronized with a first edge that is one of the rising edge and the falling edge of a reference clock CLK. The second group of signals is composed of a plurality of signals OUT2 and OUT3 synchronized with a second edge that is the other of the rising edge and the falling edge of the reference clock CLK. The transmission path TP includes a plurality of first transmission lines 100 and 120 that transmit the plurality of signals OUT0 and OUT1 composing the first group of signals and a plurality of second transmission lines 110 and 130 that transmit the plurality of signals OUT2 and OUT3 composing the second group of signals. The plurality of first transmission lines 100 and 120 and the plurality of second transmission lines 110 and 130 are alternately arranged. In other words, the plurality of first transmission lines 100 and 120 and the plurality of second transmission lines 110 and 130 are arranged in the order of the first transmission line 100, the second transmission line 110, the first transmission line 120, and the second transmission line 130.

The generating circuit GC can include a logic circuit LC and a timing adjusting circuit TC. The logic circuit LC operates in response to the reference clock CLK and generates a plurality of bit signals Q0, Q1, Q2, and Q3. The timing adjusting circuit TC generates the first group of signals that are output to the plurality of first transmission lines 100 and 120 and the second group of signals that are output to the plurality of second transmission lines 110 and 130 in accordance with the plurality of bit signals Q0, Q1, Q2, and Q3 output from the logic circuit LC.

The timing adjusting circuit TC can include a plurality of first flip flops 60 and 70 and a plurality of second flip flops 80 and 90. The plurality of first flip flops 60 and 70 generate the plurality of signals OUT0 and OUT1 composing the first group of signals by performing synchronization in accordance with the first edge that is one of the rising edge and the falling edge of the reference clock CLK. The plurality of second flip flops 80 and 90 generate the plurality of signals OUT2 and OUT3 composing the second group of signals by performing synchronization in accordance with the second edge that is the other of the rising edge and the falling edge of the reference clock CLK.

The timing adjusting circuit TC can include the signal lines 52 and 54. The signal line 52 provides the first edge that is one of the rising edge and the falling edge of the reference clock CLK to the plurality of first flip flops 60 and 70. The signal line 54 provides the second edge that is the other of the rising edge and falling edge of the reference clock CLK to the plurality of second flip flops 80 and 90. In one example, the signal line 52 is a signal line for supplying the reference clock CLK, and the signal line 54 is a signal line for supplying an inverted reference clock obtained by inverting the reference clock CLK by an inverter 50.

The signal lines 52 and 54 are preferably arranged not to intersect each other. This arrangement is advantageous in reducing the bluntness of the reference clock and the inverted reference clock signals transmitted by the respective signal lines 52 and 54. In the example shown in FIG. 1, a first rectangular area and a second rectangular area that do not overlap one another are defined, and the plurality of first flip flops 60 and 70 are arrayed in the first rectangular area and the plurality of second flip flops 80 and 90 are arrayed in the second rectangular area. Such an arrangement is advantageous in providing an arrangement in which the signal lines 52 and 54 do not intersect one another. On the other hand, for example, in an arrangement in which the plurality of first flip flops 60 and 70 and the second flip flops 80 and 90 are alternately arranged, the signal lines 52 and 54 can intersect.

In the first embodiment, the logic circuit LC can be a counter that performs a count operation in response to the reference clock CLK. The counting mode of the counter can be, for example, an up-count operation or a down-count operation, but also can be another mode. In another example, the logic circuit LC can be, for example, a circuit that generates signals, each having a random value, as the plurality of bit signals Q0, Q1, Q2, and Q3 or a circuit that outputs a value obtained by processing an input signal.

In the example shown in FIG. 1, the logic circuit LC is a counter composed by series-connecting the plurality of flip flops 10, 20, 30, and 40. The plurality of flip flops 10, 20, 30, and 40 each include a clock terminal CK, a data input terminal D, a data output terminal Q, an inverted data output terminal QB, and a reset terminal R.

The reference clock CLK is supplied to the clock terminal CK of the first flip flop 10. The inverted data output terminal QB of the flip flop 10 and the data input terminal D of the flip flop 10 are connected, and the signal Q0 is output from the data output terminal Q of the flip flop 10.

The inverted data output terminal QB of the first flip flop 10 is connected to the clock terminal CK of a second flip flop 20, and an inverted data output QB0 of the first flip flop 10 is supplied to the clock terminal CK of the second flip flop 20. The inverted data output terminal QB of the flip flop 20 and the data input terminal D of the flip flop 20 are connected, and the signal Q1 is output from the data output terminal Q of the flip flop 20.

The inverted data output terminal QB of the second flip flop 20 is connected to the clock terminal CK of a third flip flop 30, and an inverted data output QB1 of the second flip flop 20 is supplied to the clock terminal CK of the third flip flop 30. The inverted data output terminal QB of the flip flop 30 and the data input terminal D of the flip flop 30 are connected, and the signal Q2 is output from the data output terminal Q of the flip flop 30.

The inverted data output terminal QB of the third flip flop 30 is connected to the clock terminal CK of a fourth flip flop 40, and an inverted data output QB2 of the third flip flop 30 is supplied to the clock terminal CK of the fourth flip flop 40. The inverted data output terminal QB of the flip flop 40 and the data input terminal D of the flip flop 40 are connected, and the signal Q3 is output from the data output terminal Q of the flip flop 40. A reset signal RES is supplied to each reset terminal R of the flip flops 10, 20, 30, and 40 at the time of initialization.

The operation of the electronic circuit 1 shown in FIG. 1 is described in FIG. 2. Assume that each signal Q0, Q1, Q2, or Q3 is reset to low level when the reset signal RES is set to low level. The signal Q0 which is output from the first flip flop 10 transits from low level to high level at time t1 of the first rising edge of the reference clock CLK and transits from high level to low level at time t2 of the second rising edge of the reference clock CLK. In this manner, the signal Q0 toggles in accordance with the rising edge of the reference clock CLK.

The inverted data output terminal QB of the first flip flop 10 is connected to the clock terminal CK of the second flip flop 20. Therefore, the second flip flop 20 changes its output signal Q1 in response to the inverted data output QB0 of the first flip flop 10 transiting from low level to high level. More specifically, the second flip flop 20 transits its output signal Q1 from low level to high level at time t2 when the signal Q0 output from the first flip flop 10 first transits from high level to low level after the count is started. Then, at time t4 when the signal Q0 transits from high level to low level for the second time, the second flip flop 20 transits the signal Q1 from high level to low level. In this manner, the signal Q1 toggles each time the signal Q0 transits from high level to low level, that is, in accordance with the falling edge of the signal Q0 (the rising edge of the signal QB0).

The inverted data output terminal QB of the preceding flip flop is connected to each clock terminal CK of the third and subsequent flip flops 30 and 40. Therefore, the respective operations of the third and subsequent flip flops 30 and 40 are the same as the operation of the second flip flop 20 and toggle each time the output from the data output terminal Q of the preceding flip flop transits from high level to low level. In other words, the flip flops 30 and 40 toggle each time the output from the corresponding inverted data output terminal QB transits from low level to high level.

As described above, the counter as the logic circuit LC which is composed of the flip flops 10, 20, 30, and 40 generates the signals Q0, Q1, Q2, and Q3 by performing an up-count operation. The signals Q0, Q1, Q2, and Q3 are output via the timing adjusting circuit TC, which includes the first flip flops 60 and 70 and the second flip flops 80 and 90, to the transmission lines 100, 110, 120, and 130 as the signals OUT0, OUT1, OUT2, and OUT3, respectively.

The reference clock CLK is supplied, via the signal line 52, to each clock terminal CK of the first flip flops 60 and 70, and the signals Q0 and Q1 are supplied to their respective data input terminals D. Thus, the signals OUT0 and OUT1 which are output from the respective data output terminals Q of the first flip flops 60 and 70 become signals that have been obtained by delaying the respective signals Q0 and Q1 by one cycle of the reference clock CLK. On the other hand, the inverted reference clock obtained by inverting the reference clock CLK is supplied to the respective clock terminals CK of the second flip flops 80 and 90 via the inverter 50 and the signal line 54, and the signals Q2 and Q3 are supplied to their respective data input terminals D. Thus, the signals OUT2 and OUT3 which are output from the respective data output terminals Q of the second flip flops 80 and 90 become signals that have been obtained by delaying the respective signals Q2 and Q3 by half a cycle of the reference clock CLK. In other words, the signals OUT2 and OUT3 transit in accordance with the falling edge of the reference clock CLK at times ta, tb, and tc.

The signals OUT0, OUT1, OUT2, and OUT3 are output to the respective transmission lines 100, 120, 110 and 130 that compose the transmission path TP. The signals OUT0 and OUT1 which are the first and second bits of the count value are output to the first transmission lines 100 and 120, respectively. The signals OUT2 and OUT3 which are the third and the fourth bits of the count value are output to the second transmission lines 110 and 130, respectively. As exemplified in FIG. 1, the first transmission lines 100 and 120 and the second transmission lines 110 and 130 are alternately arranged. Therefore, in the transmission lines 100, 120, 110, and 130 which output the signals OUT0, OUT1, OUT2, and OUT3, signals of adjacent transmission lines will not simultaneously transit. Consequently, signal transition delays due to the parasitic capacitance between the transmission lines 100, 120, 110, and 130 are reduced. In addition, the spacing between the transmission lines 100, 120, 110 and 130 can be decreased and made uniform. Such a feature is advantageous in suppressing the increase in the circuit area of the electronic circuit 1 while increasing the speed of signal transmission.

Figure 3A:
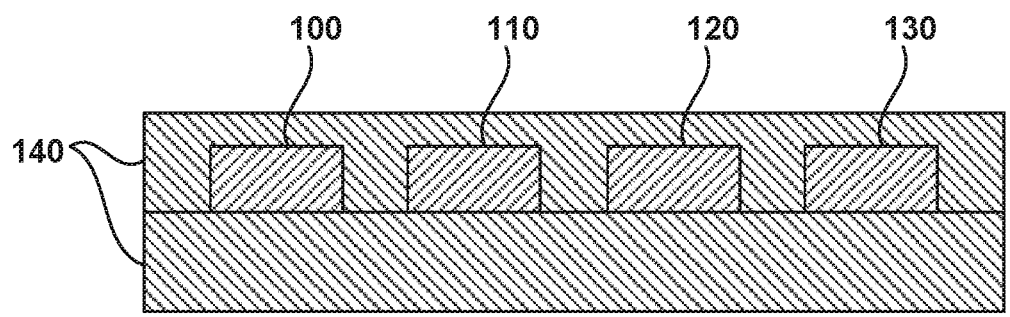
FIGS. 3A and 3B are views each exemplifying the arrangement of a plurality of transmission lines that compose a transmission path.
Figure 3B:
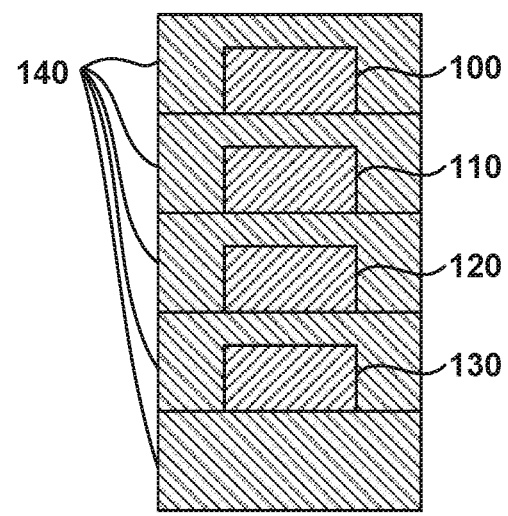

FIGS. 3A and 3B each show an example of the transmission lines 100, 120, 110, and 130 composing the transmission path TP. FIG. 3A shows an example in which the transmission lines 100, 120, 110, and 130 are arranged on the same layer, and FIG. 3B shows an example in which the transmission lines 100, 120, 110, and 130 are arranged on different layers. The transmission lines 100, 120, 110, and 130 are insulated from one another by an interlayer insulating film 140. Each of the transmission lines 100, 120, 110, and 130 can be composed of, for example, a conductive material such as aluminum or copper. Although not shown in FIGS. 3A and 3B, dummy transmission lines can be arranged next to the transmission line 100 (the left in FIG. 3A, above in FIG. 3B) and next to the transmission line 130 (the right in FIG. 3A, below in FIG. 3B) to make the parasitic capacitances of the transmission lines 100, 120, 110, and 130 uniform. If the transmission lines 100, 120, 110, and 130 are to be led a long distance, buffers can be interposed. A synchronizing circuit can be provided between the transmission lines 100, 120, 110, and 130 for transmitting the respective signals OUT0, OUT1, OUT2, and OUT3 and a transmission destination circuit of the signals OUT0, OUT1, OUT2, and OUT3. This synchronizing circuit synchronizes the signals OUT0, OUT1, OUT2, and OUT3 to only one of the rising edge and the falling edge. The third embodiment is an example including such a synchronizing circuit.

An electronic circuit 2 according to the second embodiment of the present invention will be described with reference to FIG. 4. Note that matters not mentioned in the second embodiment can comply with the first embodiment. The second embodiment includes a generating circuit GC2 which generates a first group of signals and a second group of signals and a logic circuit LC2 instead of the logic circuit LC. The logic circuit LC2 is a Gray code counter. The logic circuit LC2 includes a binary counter 150 and EXOR gates (Exclusive OR gates) 160, 170, 180, and 190. The EXOR gates 160, 170, 180, and 190 generate respective Gray code signals S0, S1, S2, and S3 from the signals Q0, Q1, Q2, and Q3 which are binary code count values output from the binary counter 150. The binary counter 150 can have, for example, the same arrangement as the logic circuit LC according to the first embodiment, but may also have another arrangement. In this example, the binary counter 150 executes the count operation in response to a reference clock CLK and generates the signals Q0, Q1, Q2, and Q3 which are the binary code count values. The binary counter 150 resets the signals Q0, Q1, Q2, and Q3 back to initial values when a reset signal RES supplied to a reset terminal RS changes to active level.

Figure 4:
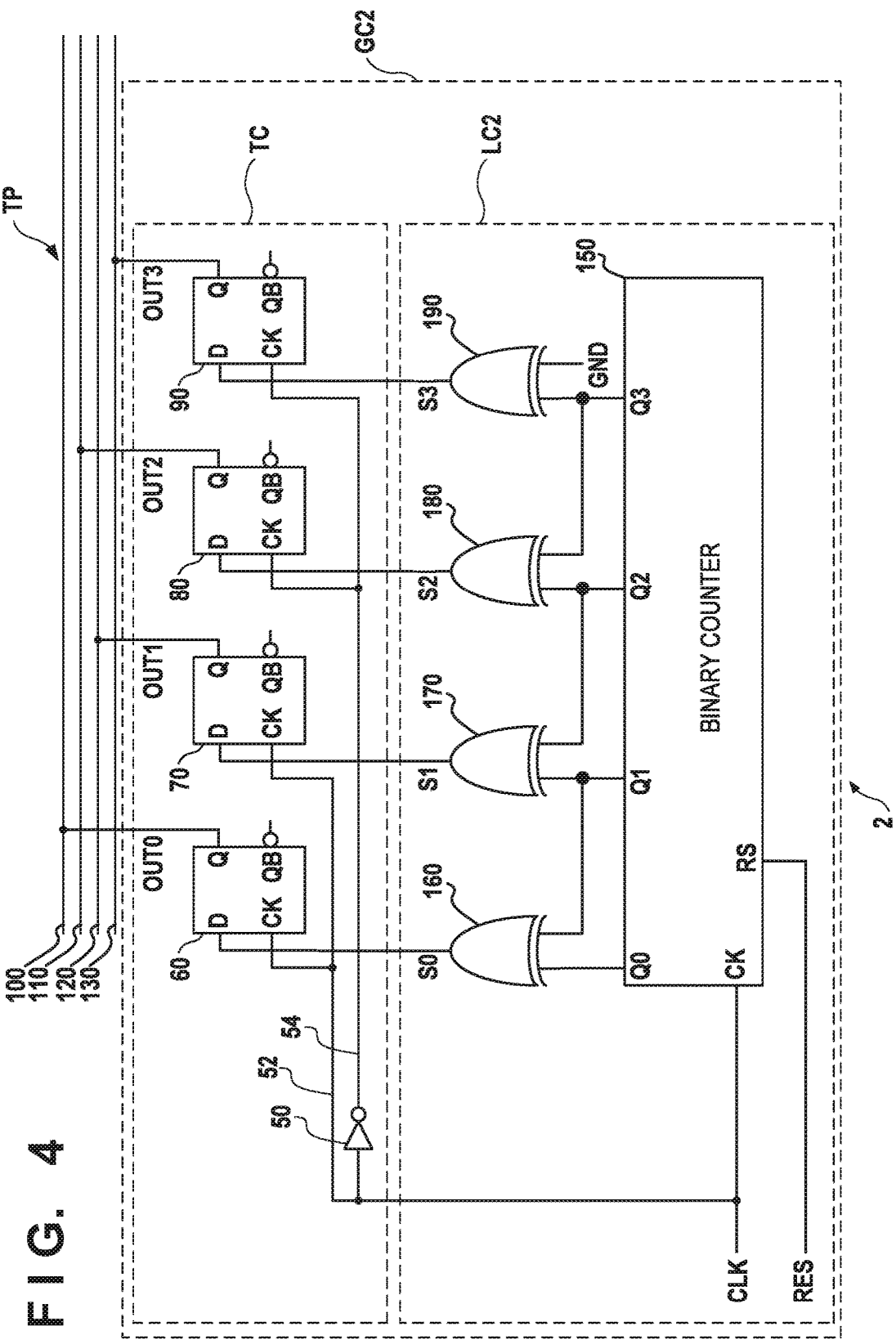
FIG. 4 is a diagram showing the arrangement of an electronic circuit or a counter according to the second embodiment.
Figure 5:
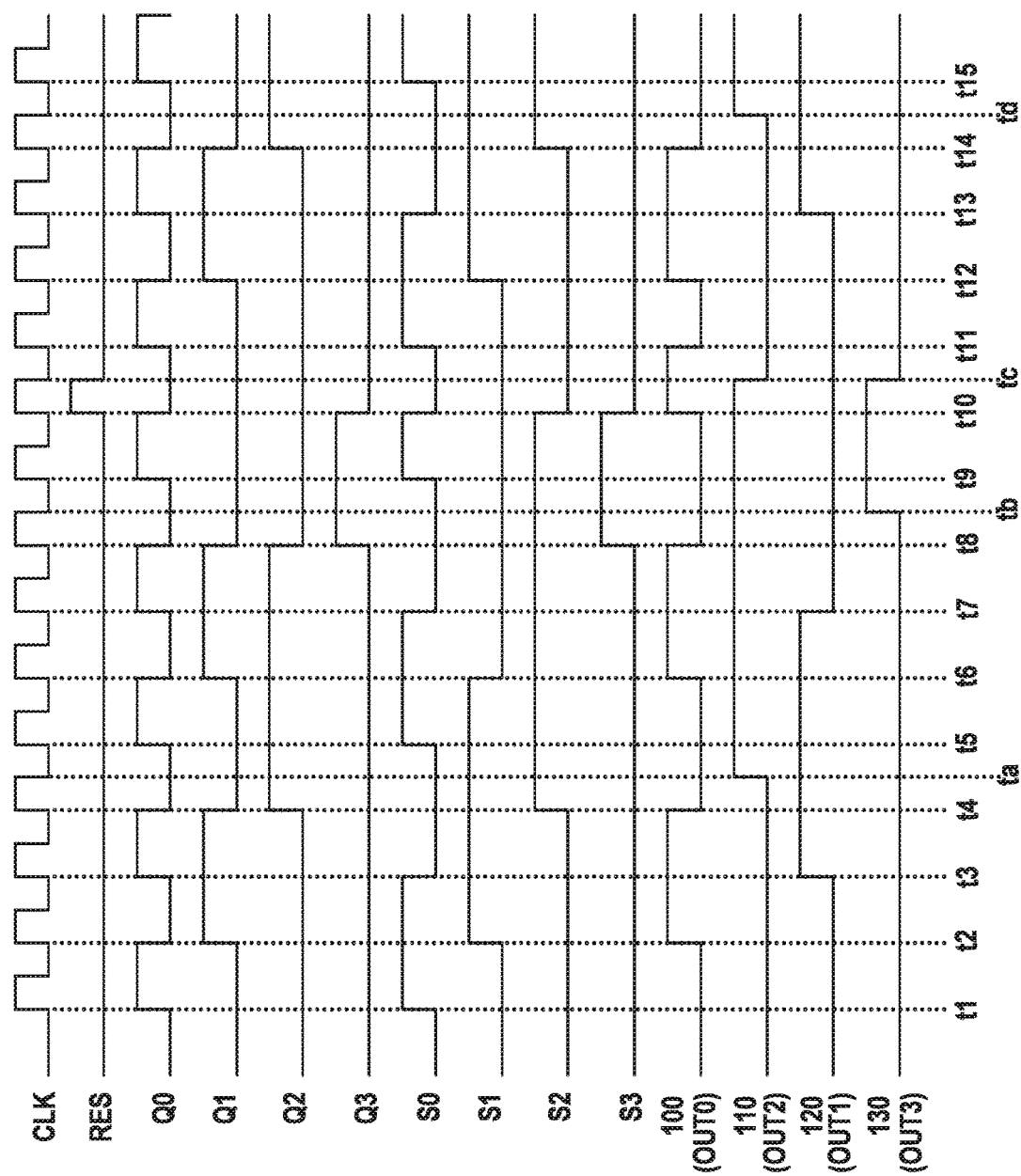
FIG. 5 is a timing chart showing an operation example according to the second embodiment.

The operation of the electronic circuit 2 shown in FIG. 4 is described in FIG. 5. Until time t10, the signals Q0, Q1, Q2, and Q3 output from the binary counter 150 are binary code count values similar to those in FIG. 2. At time t10, the reset signal RES supplied to the reset terminal RS of the binary counter 150 changes to active level, and the signals Q0, Q1, Q2, and Q3 are all reset to 0. In one example, the reset signal RES can be provided by a decoder (not shown) which detects that the signals Q0, Q1, Q2, and Q3 each have reached a predetermined value. At time t11 to t15, after the reset signal RES changes to active level, the signals Q0, Q1, Q2, and Q3 each having the same count value as those at time t1 to t5 are output.

Note that S0 which is the EXOR of Q0 and Q1, S1 which is the EXOR of Q1 and Q2, S2 which is the EXOR of Q2 and Q3, and S3 which is the EXOR of Q3 and GND (low level) are Gray code count values as shown in FIG. 5. Out of the signals S0, S1, S2, and S3 which are Gray code count values, the signal that transits at a single timing is basically one. However, at the timing in which each count value of the binary counter 150 is reset at time 10, the signals S0, S2, and S3 simultaneously transit. Therefore, even in the case of the Gray code counter, for example, a plurality of signals can transit simultaneously when counting from 0 to 9 is to be repeated. The first group of signals synchronized with only the first edge which is one of the rising edge and the falling edge of the reference clock CLK and the second group of signals synchronized with only the second edge which is the other of the rising edge and the falling edge of the reference clock CLK are generated by a timing adjusting circuit TC. A plurality of first transmission lines 100 and 120 which transmit a plurality of signals OUT0 and OUT1 composing the first group of signals and a plurality of second transmission lines 110 and 130 which transmit a plurality of signals OUT2 and OUT3 composing the second signal group are alternately arranged.

Figure 6:
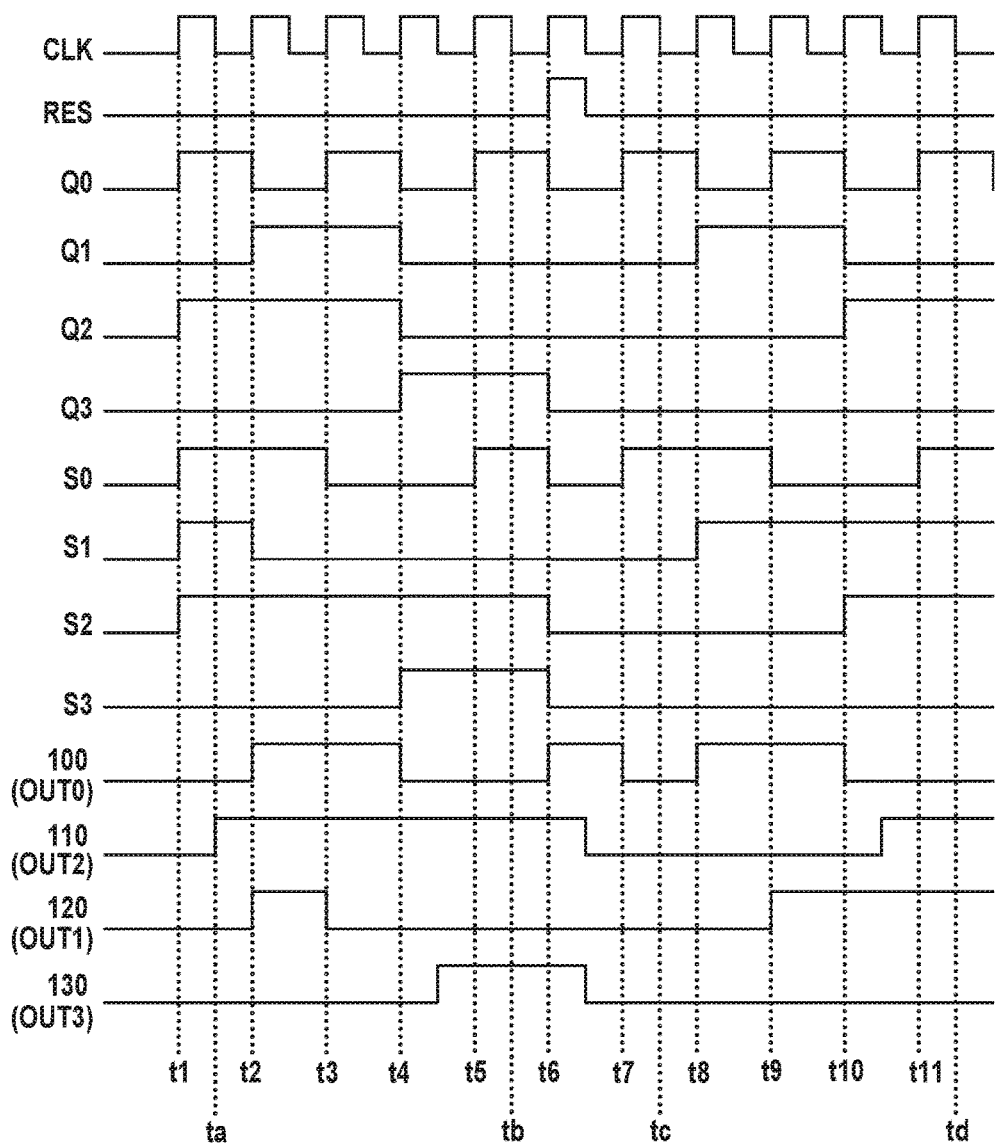
FIG. 6 is a timing chart showing another operation example according to the second embodiment.
Figure 7:
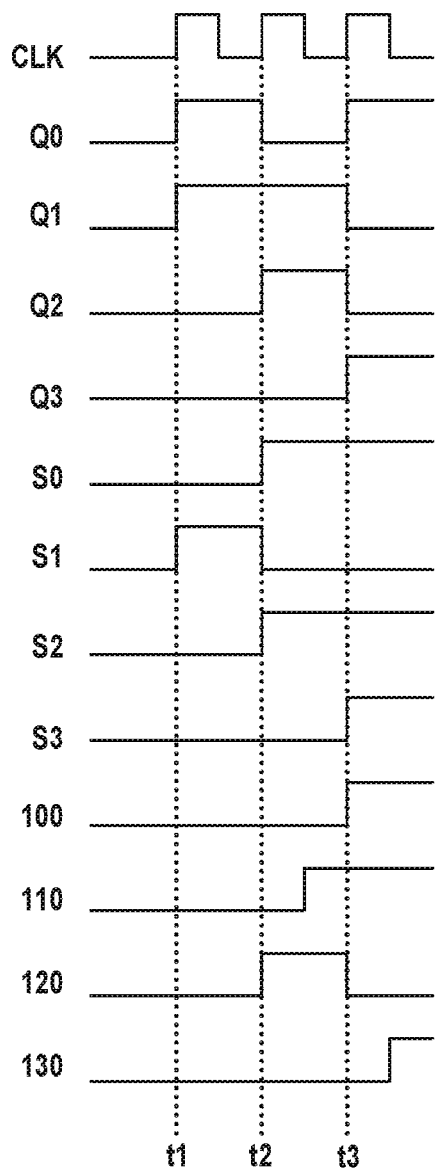
FIG. 7 is a timing chart showing yet another operation example according to the second embodiment.

In the example shown in FIG. 5, a count range is set by a function to reset each count value Q0, Q1, Q2, or Q3. Instead of this, or in addition to this, the count range can be set by a function to set the count values Q0, Q1, Q2, and Q3 as exemplified in FIG. 6. In the example shown in FIG. 6, the initial values of the signals Q0, Q1, Q2, and Q3 are set to 1, 0, 1, 0, respectively, and the count operation is started from time t1. In this case, the signals S0, S1, and S2 simultaneously transit at time t1. Also, although each count value indicated by the signal Q0, Q1, Q2, or Q3 is counted up one by one in FIG. 5, the plurality of signals composing the Gray code can simultaneously transit even in a case in which two or more values are counted up. In the example shown in FIG. 7, the signals Q0, Q1, Q2, and Q3 are counted up by three. The count value is 0 at time t1 or earlier, the count value is 3 at time t1 and t2, the count value is 6 at time t2 and t3, and the count value is 9 at time t3 to t4. In the example shown in FIG. 7, the signals S0, S1, and S2 simultaneously transit at time t2.

It is preferable that dummy transmission lines as those explained in the first embodiment are provided in the second embodiment as well.

An electronic circuit 3 according to the third embodiment of the present invention will be described with reference to FIGS. 8 and 9. The electronic circuit 3 is composed as a solid-state image sensor. The electronic circuit 3 includes counters 240 and 270. The counter 240 can be composed of a counter according to the electronic circuit 1 of the first embodiment or a counter according to the electronic circuit 2 of the second embodiment. The counter 270 can be composed of the counter according to the electronic circuit 1 of the first embodiment or the counter according to the electronic circuit 2 of the second embodiment. In one preferred example, the counter 240 is composed of the counter according to the electronic circuit 1 of the first embodiment and the counter 270 is composed of the counter according to the electronic circuit 2 according to the second embodiment.

The electronic circuit 3 can include a pixel array GA, a vertical scanning circuit 210, a horizontal scanning circuit 260, A/D (Analog/Digital) converters 220, memories 250, a reference voltage generator 230, and an output unit 280. The pixel array GA includes a plurality of pixels 200 arrayed so as to compose a plurality of rows and columns. Each pixel 200 includes a photoelectric converter (for example, a photodiode). Each pixel 200 can include an amplifying unit that outputs a signal in accordance with a charge generated by photoelectric conversion by the photoelectric converter. At least one of the vertical scanning circuit 210 and the horizontal scanning circuit 260 is a selecting circuit that selects the pixels 200 of the pixel array GA.

The vertical scanning circuit 210 selects the pixels 200 of the pixel array GA in row units. The signals (analog signals) of the pixels 200 of the row selected by vertical scanning circuit 210 are converted into digital signals by the corresponding A/D converter 220. One A/D converter 220 can be provided for each column of the pixel array GA. The counter 240 is provided to be shared among the plurality of A/D converters 220 and generates an n-bit count value (n is a natural number) by a count operation. However, a plurality of counters 240 can be included to, for example, assign one counter 240 for each predetermined number of A/D converters 220.

Each A/D converter 220 can include, for example, a comparator which compares the output signals of the pixels 200 and a reference signal output from the reference voltage generator 230. The reference signal is a signal (for example, a ramp signal) that changes with time. The comparator outputs a comparison result signal indicating the magnitude relationship of the output signals of the pixels 200 and the reference signal. The comparison result signal changes when the magnitude relationship of the output signals of the pixels 200 and the reference signal is inverted. Triggered by the change in comparison result signal, each memory 250 holds each count value supplied from the counter 240. Each digital value (count value) in accordance with the pixel signal from the pixels 200 is held by the memories 250.

The horizontal scanning circuit 260 sequentially selects each of the plurality of memories 250 corresponding to the plurality of rows of the pixel array GA and transfers the signal of the selected memory 250 to the output unit 280 in accordance with the count value supplied from the counter 270.

Figure 8:
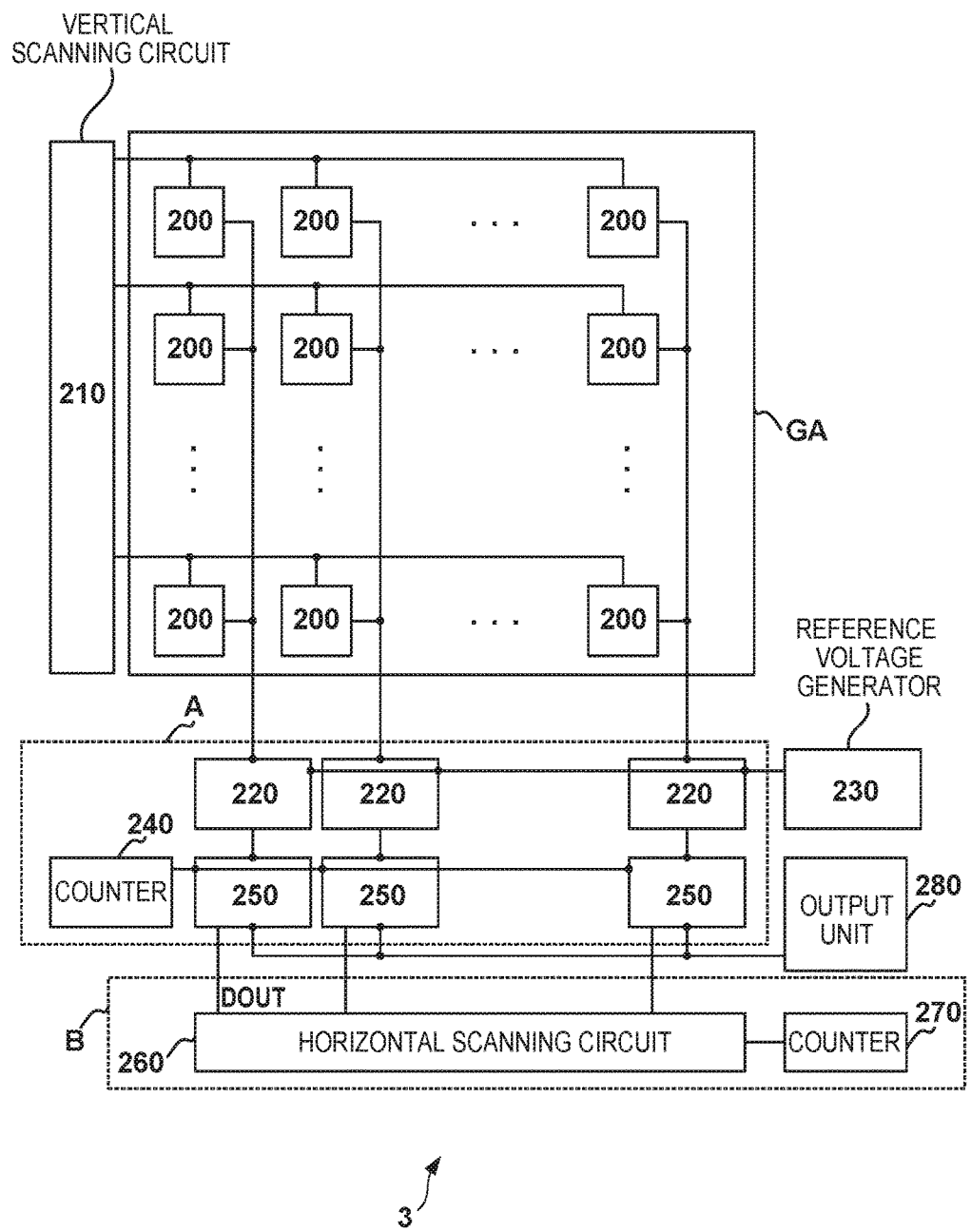
FIG. 8 is a view showing the arrangement of an electronic circuit or a solid-state image sensor according to the third embodiment.
Figure 9:
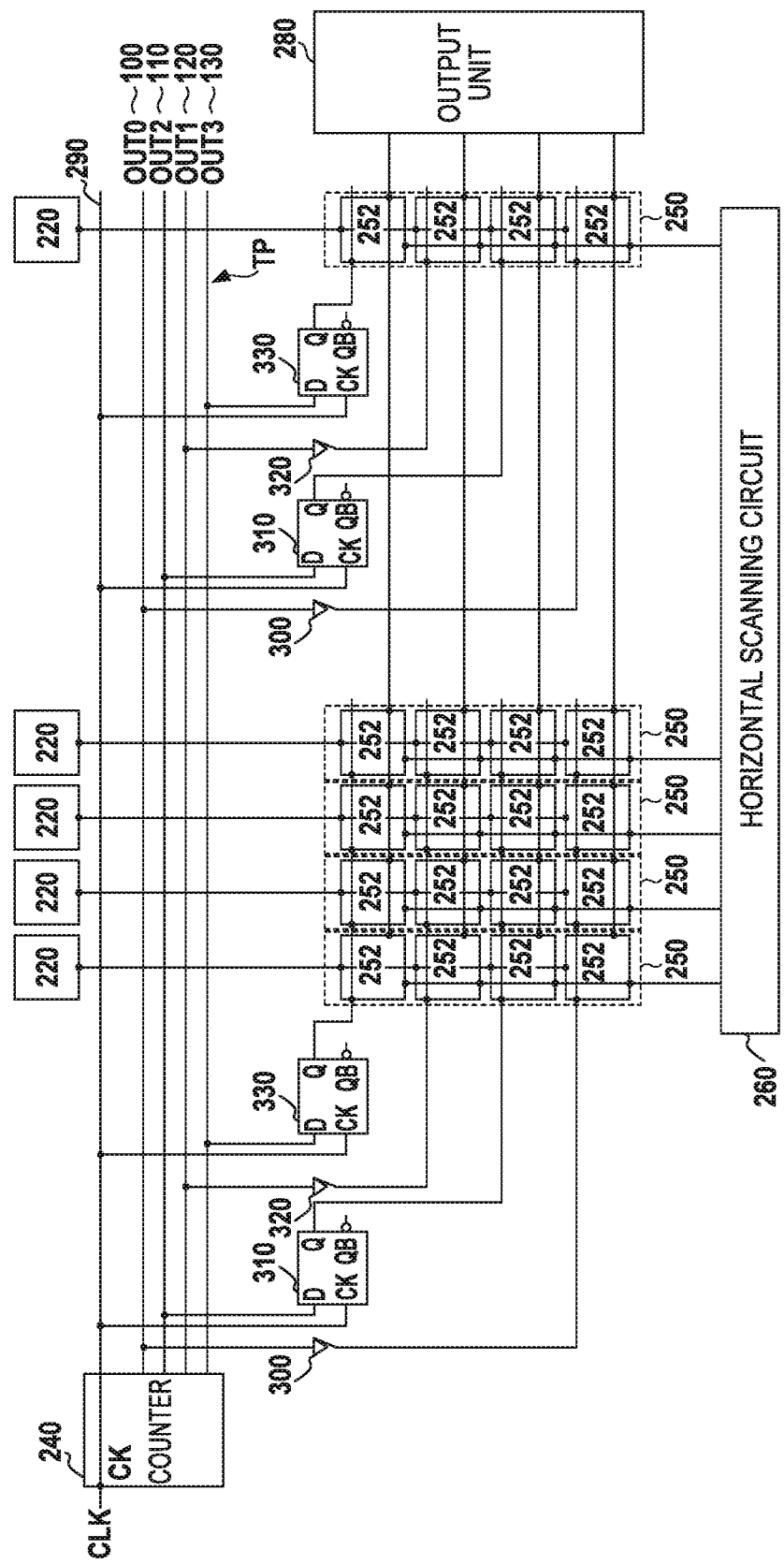
FIG. 9 is a diagram showing the arrangement of a part of the electronic circuit or the solid-state image sensor according to the third embodiment.

FIG. 9 shows a specific example of the arrangement of an area A of FIG. 8. Each memory 250 is composed of a plurality of memories 252 each holding 1-bit information. The counter 240 can be composed of, for example, a counter according to the electronic circuit 1 of the first embodiment. The count values (aforementioned signals OUT0, OUT2, OUT1, and OUT3) generated by the counter 240 are output to a transmission path TP which includes the respective transmission paths 100, 110, 120, and 130. Although each count value is a 4-bit count value in the arrangement exemplified in the first embodiment, the number of bits can be freely determined in this example. The transmission path TP can be understood as a component of the counter 240 or a component of another block. A reference clock CLK is supplied to the counter 240 via a reference clock line 90.

The signals (count values) OUT0, OUT1, OUT2, and OUT3 output to the respective transmission lines 100, 110, 120, and 130 are supplied to the memories 250 via a synchronizing circuit. The synchronizing circuit synchronizes the signals OUT0, OUT1, OUT2, and OUt3 with the reference clock CLK so that all are synchronized with one of the rising edge and the falling edge of the reference clock CLK. In the examples shown in FIG. 9, the signals OUT0 and OUT1 output to the respective transmission lines 100 and 120 are signals synchronized with the rising edge of the reference clock CLK and are supplied, via buffers 300 and 320, to memories 250 each holding the corresponding bit signals. On the other hand, the signals OUT2 and OUT3 output to the respective transmission lines 110 and 130 are signals synchronized with the falling edge of the reference clock CLK. Accordingly, the signals OUT2 and OUT3 output to the respective transmission lines 110 and 130 are synchronized by flip flops 310 and 330, which operate in accordance with the rising edge of the reference clock CLK, and are supplied to the memories 250 each holding the corresponding bit signals.

By transmitting the signals OUT0, OUT1, OUT2, and OUT3 in an arrangement as described above, the spacing between each transmission lines 100, 120, 110, and 130 can be decreased and made uniform.

Additionally, according to the third embodiment, the following effect can be provided. In a conventional method, the influence (signal transition speed) from the mutual capacitive coupling of the plurality of transmission lines depends strongly on the count values (the number of bits transited by each signal). Therefore, if count values are supplied to the memories 250 by the conventional method, the transition time of one count value to another count value depends strongly on these count values and the linearity of A/D conversion can decrease. On the other hand, in the third embodiment, since the influence from the mutual capacitive coupling of the transmission lines 100, 110, 120, and 130 is reduced, the transition time of one count value to another count value is made uniform and the linearity of A/D conversion can be improved.

The drivability of the buffers 300 and 320 and the drivability of the flip flops 310 and 330 are preferably equal to each other. In addition, in the third embodiment, dummy transmission lines are preferably provided next to the respective transmission lines 100 and 130. Further, a dummy transmission line can be provided on both sides of a transmission line 290 so that the parasitic capacitance accompanying the transmission line 290 can be made uniform with that of the transmission lines 100, 110, 120, and 130. This is because the outputs of the flip flops 310 and 330 transit in response to the reference clock CLK transmitted through the transmission line 290. Therefore, if the parasitic capacitance of the transmission line 290 greatly differs from that of the transmission lines 100 and 120, the transition timing of the outputs from the buffers 300 and 320 and the transition timing of the outputs from the flip flops 310 and 330 will shift.

Figure 10:
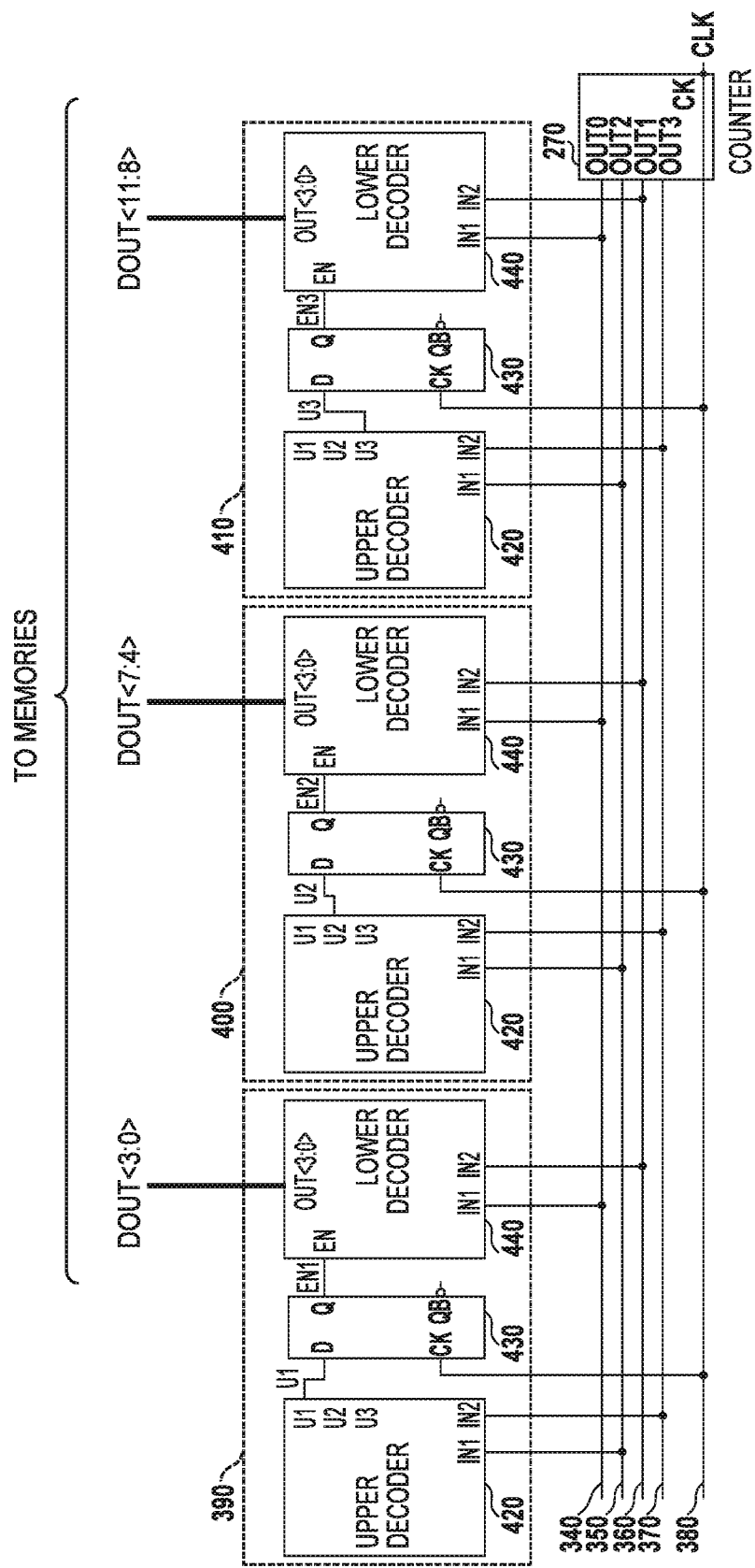
FIG. 10 is a diagram showing the arrangement of another part of the electronic circuit or the solid-state image sensor according to the third embodiment.

FIG. 10 shows a specific example of the arrangement of an area B of FIG. 8. The counter 270 is composed of, for example, the counter according to the electronic circuit 2 of the second embodiment. However, the signals OUT0, OUT2, OUT1, and OUT3 as count values are output to respective transmission lines 340, 350, 360, and 370. The transmission lines 340, 350, 360, and 370 are arranged sequentially in the order of the transmission line 340, 350, 360, and 370.

The horizontal scanning circuit 260 is a decoder composed of a plurality of unit circuits 390, 400, and 410. The reference clock CLK is supplied, via a reference clock line 380, to the counter 270 and the plurality of unit circuits 390, 400, and 410 composing the horizontal scanning circuit 260.

Each of the plurality of unit circuits 390, 400, and 410 composing the horizontal scanning circuit 260 includes an upper decoder 420, a flip flop 430, and a lower decoder 440. The signals OUT2 and OUT3 are input to respective input terminals IN1 and IN2 of each upper decoder 420, and the output of each upper decoder 420 is supplied to the corresponding flip flop 430. The arrangements of the respective circuit units 390, 400, and 410 are approximately the same, but differ in terms of which output terminal of the upper decoder 420 is to be connected to a data terminal D of the flip flop 430. An output terminal U1 of the unit circuit 390, an output terminal U2 of the unit circuit 400, and an output terminal U3 of the unit circuit 410 each are connected to the terminal D of the corresponding flip flop 430. The reference clock CLK is supplied to a clock terminal CK of each flip flop 430, and an output terminal Q is connected to an enable terminal EN of each lower decoder 440. The signals OUT0 and OUT1 are supplied to respective input terminals IN1 and IN2 of the lower decoder 440, and the decoding result is output to a corresponding output terminal OUT <3:0>.

Figure 11:
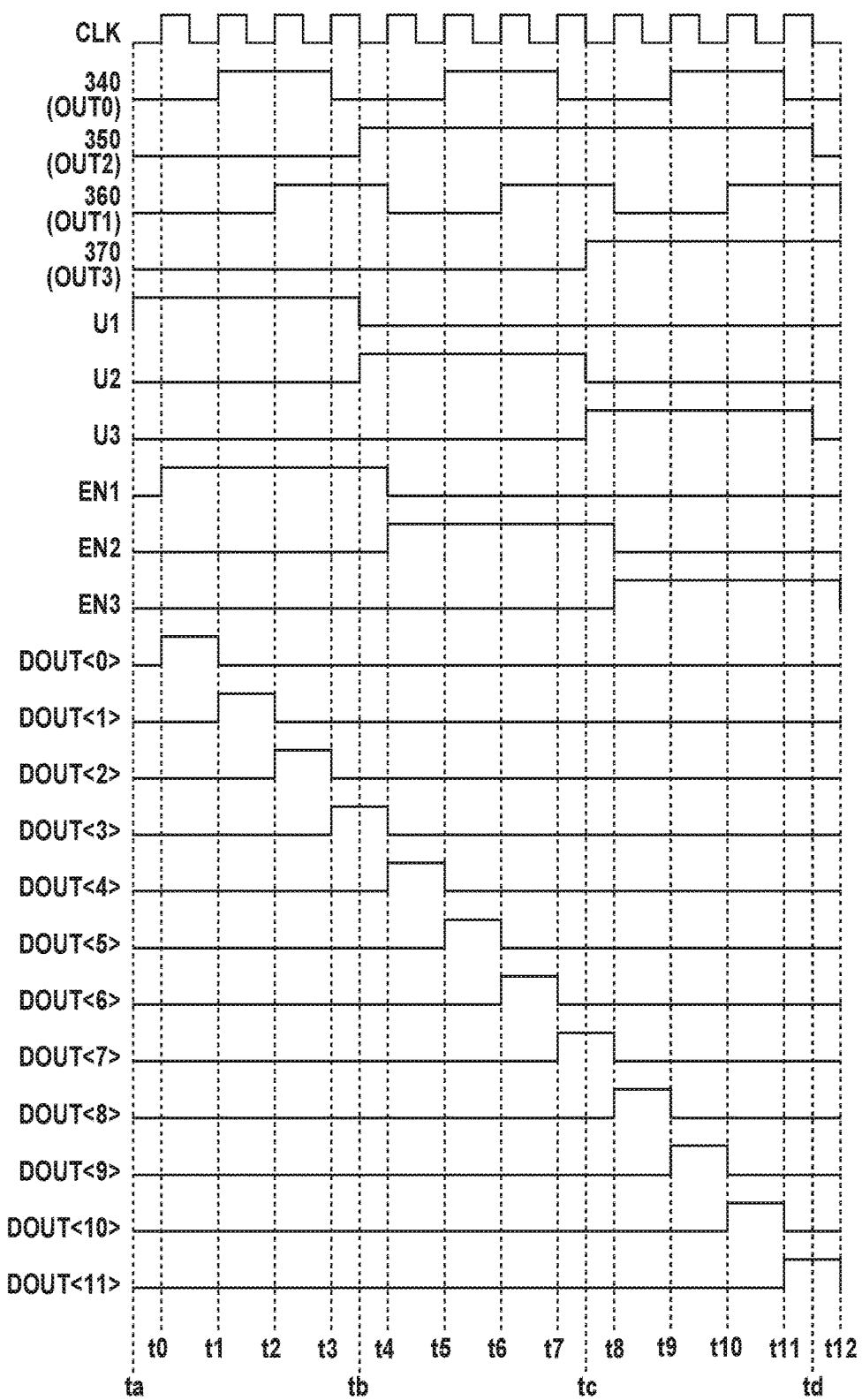
FIG. 11 is a timing chart showing an operation example of the electronic circuit or the solid-state image sensor according to the third embodiment.

FIG. 11 shows a timing chart of the arrangement shown in FIG. 10. The signals OUT0, OUT1, OUT2, and OUT3 output from the counter 270 are signals indicating the Gray code count values. The signals OUT0 and OUT1 are signals to be synchronized with the rising edge of the reference clock CLK, and the signals OUT2 and OUT3 are signals to be synchronized with the falling edge of the reference clock CLK.

The signals OUT0 and OUT1 output from the counter 270 are Gray code count value signals that are counted up in synchronization with the rising edge of the reference clock CLK. The count values composed of the respective signals OUT0 and OUT1 each change from 0 to 1 at time t1, 1 to 2 at time t2, 2 to 3 at time t3, and to 0 at time t4, and the same operation is subsequently repeated. That is, the count values composed of the respective signals OUT0 and OUT1 each repeat the counting from 0 to 3. On the other hand, the signals OUT2 and OUT3 output from the counter 270 are Gray code count value signals that are counted up in synchronization with the falling edge of the reference clock CLK. The cycle in which the count values composed of the signals OUT2 and OUT3 change from 0 to 3 is ¼ of the cycle in which the count values composed of the signals OUT0 and OUT1 change from 0 to 3. The count values composed of the signals OUT2 and OUT3 each change from 0 to 1 at time tb, 1 to 2 at time tc, and 2 to 3 at time td.

The output terminals U1, U2, and U3 of each upper decoder 420 change to high level when the count values composed of the signals OUT2 and OUT3 supplied to the respective input terminals IN1 and IN2 change to 0, 1, and 2. Therefore, U1 which is the input signal to the flip flop 430 of the unit circuit 390 changes to high level at time ta to tb. U2 which is the input signal to the flip flop 430 of the unit circuit 400 changes to high level at time tb to tc. U3 which is the input signal to the flip flop 430 of the unit circuit 410 changes to high level from time tc to td.

The flip flop 430 of the unit circuit 390 delays the rising edge of the input signal U1 by half a cycle of the reference clock CLK (that is, changes a signal EN1 to high level in synchronization with the rising edge of the reference clock CLK). The flip flop 430 of the unit circuit 400 delays the rising of the input signal U2 by half a cycle of the reference clock CLK (that is, changes a signal EN2 to high level in synchronization with the rising edge of the reference clock CLK). The flip flop 430 of the unit circuit 410 delays the rising of the input signal U3 by half a cycle of the reference clock CLK (that is, changes a signal EN3 to high level in synchronization with the rising edge of the rising edge of the reference clock CLK).

In each lower decoder 440, when the enable signal ENx (x is 1 to 3) is at low level, the output terminal OUT <3:0> changes to low level. On the other hand, when the enable signal ENx is at high level, the output signals DOUT <0>, DOUT <1>, DOUT <2>, and DOUT <3> each change to high level when count values of the count value signals input from the respective input terminals IN1 and IN2 change to 0, 1, 2, and 3. Therefore, at time t0 to t4 when the enable signal EN1 is at high level, the output terminal OUT <3:0> of the lower decoder 440 of the unit circuit 390 sequentially changes to high level. That is, the output signals DOUT <0>, <1>, <2>, and <3> sequentially change to high level. At time t4 to t8 when the enable signal EN2 is at high level, the output terminal OUT <3:0> of the lower decoder 440 of the unit circuit 400 sequentially changes to high level. That is, the output signals DOUT <4>, <5>, <6>, and <7> sequentially change to high level. At time t8 to t12 when the enable signal EN3 is at high level, the output terminal OUT <3:0> of the lower decoder 440 of the unit circuit 410 sequentially changes to high level. That is, the output signals DOUT <8>, <9>, <10>, and <11> sequentially change to high level.

According to the third embodiment, as in the same manner in which the influence from the mutual capacitive coupling of the above-described transmission lines 100, 110, 120, and 130 is reduced, the influence from the mutual capacitive coupling of the transmission lines 340, 350, 360, and 370 is reduced. Thus, the transition time of one count value to another count value for the count values transmitted via the respective transmission lines 340, 350, 360, and 370 is made uniform. This allows each pulse width of output signals DOUT <0> to <12> to be uniform and each period in which the data of memories 250 is output to the output unit 280 to be uniform. Therefore, it becomes possible to prevent a column with an extremely short readout time from being generated and to perform a more rapid readout operation. The parasitic capacitances accompanying the respective transmission lines 340, 350, 360, 370, and 380 are preferably made uniform.

Note that although the above-described example showed an arrangement in which the counter 270 is connected to the horizontal scanning circuit 260, it can be an arrangement in which the counter 270 is connected to the vertical scanning circuit 210. In the above-described example, a transmission line which transmits a signal synchronized with the rising edge and a transmission line which transmits a signal synchronized with the falling edge are alternately arranged in both the transmission lines 100 to 130 connected to the counter 240 and the transmission lines 340 to 370 connected to the counter 270. Instead of this arrangement, a transmission line which transmits a signal synchronized with the rising edge and a transmission line which transmits a signal synchronized with the falling edge can be alternately arranged in the transmission lines 100, 110, 120, and 130 connected to the counter 240. Alternatively, the transmission line which transmits a signal synchronized with the rising edge and the transmission line which transmits a signal synchronized with the falling edge can be alternately arranged in the transmission lines 340, 350, 360, and 370 connected to the counter 270.

As an application example of the solid-state image sensor according to each of the above-described electronic circuits, a camera incorporating the solid-state image sensor will be explained below. The concept of the camera includes not only an apparatus whose main purpose is imaging, but also an apparatus (for example, a personal computer or portable terminal) having an imaging function as an auxiliary function. The camera can include the solid-state image sensor according to the present invention exemplified in the above-mentioned embodiments, and a processing unit that processes an output signal from the solid-state image sensor. This processing unit can include an A/D converter, and a processor that processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-039318, filed Feb. 27, 2015, which is hereby incorporated by reference herein in its entirety.

What is claimed is:

1. An electronic circuit comprising:
   a first circuit configured to receive a first signal synchronized with a first edge that is one of a rising edge and a falling edge of a clock signal, and to output a second signal synchronized with the first edge;
   a second circuit configured to receive the second signal and to output a third signal converted from the second signal, the third signal being synchronized with a second edge that is the other of the rising edge and the falling edge; and
   a third circuit configured to receive the third signal and a fourth signal synchronized with the second edge and to output a fifth signal synchronized with the second edge.

2. The electronic circuit according to claim 1, wherein a cycle of the first signal is larger than a cycle of the fourth signal.

3. The electronic circuit according to claim 1, wherein the second circuit is further configured to receive the clock signal and to generate the third signal in accordance with the second signal and the clock signal.

4. The electronic circuit according to claim 1, wherein the first circuit is further configured to receive a sixth signal synchronized with the first edge and to generate the second signal in accordance with the first signal and the sixth signal.

5. The electronic circuit according to claim 4, further comprising:
   a signal generator configured to generate the first signal, the fourth signal, and the sixth signal;
   a first transmission line configured to transmit the first signal from the signal generator to the first circuit;
   a second transmission line configured to transmit the fourth signal from the signal generator to the third circuit; and
   a third transmission line configured to transmit the sixth signal from the signal generator to the first circuit,
   wherein the second transmission line is arranged between the first transmission line and the third transmission line.

6. The electronic circuit according to claim 4, wherein the third circuit is further configured to receive a seventh signal synchronized with the second edge and having a phase different from that of the fourth signal, and
   wherein the third circuit is further configured to generate the fifth signal in accordance with the third signal, the fourth signal, and the seventh signal.

7. The electronic circuit according to claim 6, further comprising:
   a signal generator configured to generate the first signal, the fourth signal, the sixth signal, and the seventh signal;
   a first transmission line configured to transmit the first signal from the signal generator to the first circuit;
   a second transmission line configured to transmit the fourth signal from the signal generator to the third circuit; and
   a third transmission line configured to transmit the sixth signal from the signal generator to the first circuit; and
   a fourth transmission line configured to transmit the seventh signal from the signal generator to the third circuit,
   wherein the first transmission line is arranged between the third transmission line and the fourth transmission line, and the second transmission line is arranged between the first transmission line and the third transmission line.

8. A solid state image sensor comprising:
   an electronic circuit according to claim 1;
   a plurality of pixels arranged to form a plurality of rows and a plurality of columns; and
   a plurality of memories respectively corresponding to the plurality of columns,
   wherein the electronic circuit includes a plurality of sets each including the first circuit, the second circuit, and the third circuit, with the plurality of sets respectively corresponding to the plurality of memories, and with the third circuit of each of the plurality of sets being connected to a corresponding memory of the plurality of memories.

9. The electronic circuit according to claim 1, further comprising:
   a generating circuit having a first output node and a second output node, the first output node configured to output the first signal, the second output node configured to output the fourth signal, the fourth signal having a cycle shorter than a cycle of the first signal; and
   a transmission path including a first transmission line and a second transmission line, the first transmission line being electrically connected to the first output node, the second transmission line being electrically connected to the second output node,
   wherein the first circuit is electrically connected to the first transmission line, and wherein the third circuit is electrically connected to the second transmission line.

10. The electronic circuit according to claim 9, wherein the generating circuit includes a logic circuit configured to generate a plurality of bit signals by operating in response to the clock signal and a timing adjusting circuit configured to generate the first signal and the fourth signal in accordance with the plurality of bit signals output from the logic circuit.

11. The electronic circuit according to claim 10, wherein the timing adjusting circuit includes a plurality of first flip flops configured to generate the first signal by performing synchronization in accordance with the first edge and a plurality of second flip flops configured to generate the fourth signal by performing synchronization in accordance with the second edge, and
a signal line configured to provide the first edge to the plurality of first flip flops and a signal line configured to provide the second edge to the plurality of second flip flops do not intersect with each other.

12. The electronic circuit according to claim 11, wherein the logic circuit includes a counter configured to perform a count operation in response to the clock signal.

13. The electronic circuit according to claim 10, wherein the logic circuit includes a counter configured to perform a count operation in response to the clock signal.

14. The electronic circuit according to claim 13, wherein the counter comprises a binary counter.

15. The electronic circuit according to claim 13, wherein the counter comprises a Gray code counter.

16. The electronic circuit according to claim 15, wherein the counter has at least one of a function to reset a count value and a function to set a count value.

17. The electronic circuit according to claim 9,
wherein the generating circuit generates a first group of signals including the first signal, and a second group of signals including the fourth signal,
wherein the first group of signals are synchronized with the first edge, and the second group of signals are synchronized with the second edge,
wherein the transmission path includes a plurality of first transmission lines including the first transmission line, each configured to transmit a corresponding one of the first group of signals and a plurality of second transmission lines including the second transmission line, each configured to transmit a corresponding one of the second group of signals, and
wherein the plurality of first transmission lines and the plurality of second transmission lines are alternately arranged.

18. A camera comprising:
a solid state image sensor including the electronic circuit according to claim 1; and
a processor configured to process a signal output from the solid state image sensor.

* * * * *